United States Patent [19]

Miyata et al.

[11] 3,784,886

[45] Jan. 8, 1974

[54] BIDIRECTIONAL SWITCHING SEMICONDUCTOR DEVICE

[75] Inventors: Kenji Miyata; Masahiro Okamura, both of Hitachi, Japan

[73] Assignee: Hitachi, Ltd., Tokyo, Japan

[22] Filed: Oct. 3, 1972

[21] Appl. No.: 294,577

Related U.S. Application Data

[63] Continuation of Ser. No. 25,119, April 2, 1970, abandoned.

[30] Foreign Application Priority Data

Apr. 4, 1969 Japan .............................. 44/25562

[52] U.S. Cl. ......... 317/235 R, 307/305, 317/235 P, 317/235 AA, 317/235 AB

[51] Int. Cl........ H01l 9/12, H01l 11/10, H01l 19/00

[58] Field of Search............... 317/235 AA, 235 AB, 317/235 P; 307/252 B, 252 T, 287, 324

[56] References Cited

OTHER PUBLICATIONS

Storm et al., "A Bilateral Silicon Switch," IEEE Trans. on Electron Devices Vol. ED-14, No. 6, June, 1967, pp. 330-333.

*Primary Examiner*—John W. Huckert
*Assistant Examiner*—William D. Larkins
*Attorney*—Charles E. Wands

[57] ABSTRACT

A bidirectional switching semiconductor device comprising a pair of four layer switching semiconductor devices which are connected in reverse parallel with each other; the base layers of respective devices being electrically connected to each other, thereby improving the turn-on characteristics of the device.

8 Claims, 9 Drawing Figures

INVENTORS

KENJI MIYATA and MASAHIRO OKAMURA

BY Craig, Antonelli, Stewart & Hill
ATTORNEYS

INVENTORS

KENJI MIYATA and MASAHIRO OKAMURA

BY Craig, Antonelli, Stewart & Hill
ATTORNEYS

BIDIRECTIONAL SWITCHING SEMICONDUCTOR DEVICE

This is a continuation, of application Ser. No. 25,119 filed Apr. 2, 1970

BACKGROUND OF THE INVENTION

The present invention relates to an improvement in a bidirectional semiconductor switching element. A sectional view of a conventional two-electrode type of bidirectional semiconductor switching element is depicted in FIG. 1 and has a voltage-current characteristic as is shown in FIG. 2. This bidirectional switching semiconductor device is manufactured by preparing a semiconductor substrate having either one of two conductivities (N-type is shown). Impurities giving another type of conductivity are diffused into both of principal surfaces of the semiconductor substrate so as to form intermediate layers having another type of conductivity (P-type is shown). Then, impurities giving the same conductivity as the substrate itself are diffused into one part of each of said intermediate layers in such a manner that said last mentioned diffused areas are disposed symmetrically on both sides to form outermost layers (N-type is shown). Finally, electrodes are provided, each being adapted to short-circuit the outermost layers.

However, since the bidirectional switching semiconductor device thus constructed has so many junctions, a long diffusion period is required to form each of the conductive layers. Another disadvantage in manufacture is the difficulty in the aligning of patterns. Furthermore, junctions $Jc_1$, $Jc_2$ which determine turn-on voltage (shown in FIG. 2) of this element are formed by diffusion, which requires a long time, so that the concentration gradients of impurity at the junctions become relatively small, causing a high breakdown voltage at the $Jc_1$, $Jc_2$ junctions, which makes it very difficult to obtain an element having a turn-on voltage $V_{BO}$ of 20 V or below.

SUMMARY OF THE INVENTION

It is therefore an object of the present invention to provide a bidirectional switching semiconductor device having a low turn-on voltage.

It is another object of the present invention to provide a bidirectional switching semiconductor device which can be manufactured easily.

A bidirectional siwtching semiconductor device of the invention comprises a pair of four layer semiconductor devices which are connected reversely in parallel with each other, i.e., the electrodes connect regions of opposite conductivity between the pairs in which base layers of the respective devices are electrically connected to each other.

The present invention relates to a bidirectional semiconductor switching element which comprises a first region having either one of two types of conductivity, that is, either P-type or N-type, second and third regions having another type of conductivity each being provided independently on both sides of said first region and a fourth region situated adjacent to said third region and having a conductivity which is the same as that of the first region. The breakdown voltages at the PN junctions formed between said first region and the second region and between said first region and the third region are made large as compared with the breakdown voltage at the PN junctions formed between said third region and the fourth region. The semiconductor switching elements having four layers thus formed are connected reversely in parallel to one another so as to form a composite element, and further the third regions and the first region respectively of both of the four-layer semiconductor switching elements are short circuited.

Furthermore, the present invention relates to a bidirectional semiconductor switching element comprising a first region having one of two conductivities, two second regions each having another conductivity formed independently of one another by diffusion on one of the principal surfaces of the first region which is formed of a semiconductor layer having one of either conductivities. The element also contains third regions each having another conductivity formed by diffusion on the same principal surface as said first region so as to surround at least one part of said two second regions through said first region, and two fourth regions having one of two conductivities formed independently with respect to on another by diffusion. Each of the fourth regions faces said two second regions, said two second regions and the fourth regions being short-circuited electrically between regions which are not opposing each other.

The construction of the present invention is such that two semiconductor rectifying elements each having a control electrode are connected reversely in parallel with each other, and both of the gates are connected electrically with each other.

BRIEF DESCRIPTION OF THE DRAWINGS

FIGS. 4 through 9 show manufacturing processes of an example of the bidirectional semiconductor switching element according to the present invention wherein FIG. 5 is a sectional view taken through the line V—V in FIG. 4, FIG. 8 is a sectional view taken through the line VIII—VIII in FIG. 7 and FIG. 9 is a plan view showing a completed bidirectional semiconductor switching element.

With reference to FIG. 3, 1 designates the first four-layer semiconductor switching element consisting of the first region $N_{10}$, the second region $P_{20}$, the third region $P_{30}$ and the fourth region $N_{40}$. 2 designates the second four-layer semiconductor switching element consisting of the first region $N_{11}$, the second region $P_{21}$, the third region $P_{31}$ and the fourth region $P_{41}$. These four-layer semiconductor switching elements 1 and 2 are connected reversely in parallel and the third regions $P_{30}$ and $P_{31}$ are short circuited to each other. The breakdown voltages of junction $P_{30}-P_{40}$ and junction $P_{31}$–$N_{41}$ formed between the third regions $P_{30}P_{31}$ and the fourth regions $P_{40}$, $P_{41}$, respectively, of both of the semiconductor switching elements are made small as compared with the breakdown voltages of the junction $P_{20}$–$N_{10}$ and the junction $P_{21}$–$N_{11}$ formed between the first regions $N_{10}$, $N_{11}$ and the second regions $P_{20}$, $P_{21}$, respectively, and the breakdown voltages of junction $N_{10}$–$P_{30}$ and the junction $N_{11}$–$P_{31}$ formed between the first regions $N_{10}$, $N_{11}$ and the third regions $P_{30}$, $P_{31}$, respectively, each of the regions of these four-layer semiconductor switching elements being formed by a diffusion or an epitaxial method.

Figure 1:
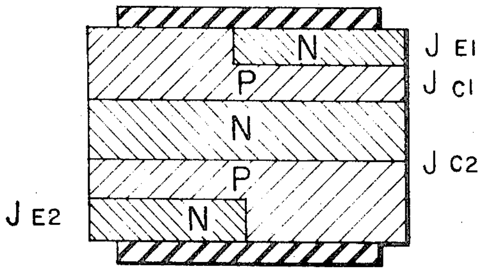
FIG. 1 PRIOR ART
FIG. 1 is a sectional view of a conventional bidirectional semiconductor switching element.
Figure 2:
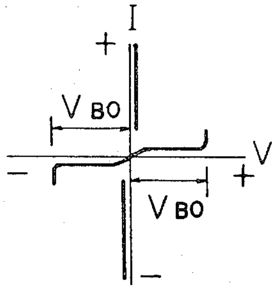
FIG. 2 is a graph showing a voltage-current characteristic of the bidirectional semiconductor switching element.
Figure 3:
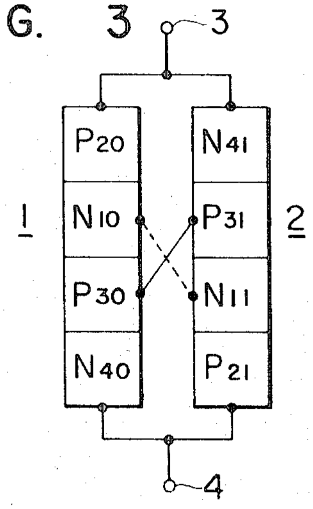
FIG. 3 is a diagram showing a principle of the bidirectional semiconductor switching element according to the present invention.

Accordingly, when the terminal 3 in FIG. 3 is applied with a positive voltage and the terminal 4 is applied with a negative voltage, the junction on $P_{30}$–$N_{40}$ is biased in the forward (conductive) direction and the junction $P_{31}$ – $N_{41}$ is biased in the reverse direction. Since the breakdown voltage of the junction $P_{30}$ – $N_{10}$ is larger than that of the junction $P_{31}$–$N_{41}$, the current passing through the junction $P_{31}$ – $N_{41}$ abruptly increases when the voltage applied across the terminals 3 and 4 is raised to exceed the breakdown voltage of the junction $P_{31}$–$N_{41}$. The current thus abruptly increased passes through the junction $P_{30}$–$N_{40}$ and when this current reaches a value sufficient to trigger the first four layer semiconductor switching element, the element is shifted to its ON state.

In the case where the voltage between the terminals 3 and 4 is reversed and the voltage applied across the junction $P_{30}$–$N_{40}$ exceeds the breakdown voltage of the same junction, the current flowing through the junction $P_{31}$–$N_{41}$ is increased and the second four layer semiconductor switching element is brought into the ON state.

As described above, the turn-on voltage $V_{BO}$ of the bidirectional semiconductor switching element as shown in FIG. 3 is determined by the breakdown voltage of the junction $P_{30}$–$N_{40}$ or $P_{31}$–$N_{41}$ having a lower breakdown voltage than the other. Thus, selecting the breakdown voltage of the latter suitably, a bidirectional semiconductor element having a lower turn-on voltage $V_{BO}$ can be obtained.

Furthermore, according to the present invention, the first regions $N_{10}$ and $N_{11}$, in both of the four layer semiconductor elements 1 and 2 which have been connected as indicated by the full line, may be short-circuited as indicated by the dotted line and a bidirectional semiconductor switching element of a lower turn-on voltage can be obtained without affecting the operational characteristics. More specifically, since the breakdown voltages of the junctions $N_{10}P_{20}$ and $N_{11}P_{21}$ are higher than those of the junctions $P_{30}$–$N_{40}$ and $P_{31}$–$N_{41}$, respectively, the turn-on voltage of the element is determined by the latter junctions. Accordingly, the first regions $N_{10}$ and $N_{11}$ of both of the four layer semiconductor switching elements 1 and 2 can be manufactured as a common substrate.

In addition, by connecting the regions $P_{30}$ and $N_{40}$ and $N_{41}$ and $P_{31}$ in both of the semiconductor elements as shown in FIG. 3 through respective resistors, an injecting current flowing each of the junctions $P_{30}$–$N_{40}$ and $N_{41}$ – $P_{31}$ can be decreased when both of the four layer semiconductor switching elements are in the OFF state under application of a voltage, and the dynamic characteristics and the temperature characteristics of the four layer elements can be improved.

An example of manufacturing processes of the bidirectional semiconductor switching element according to the present invention which is constructed on a common semiconductor substrate bases on the above described principle is shown in FIGS. 4 through 9.

Figure 4:
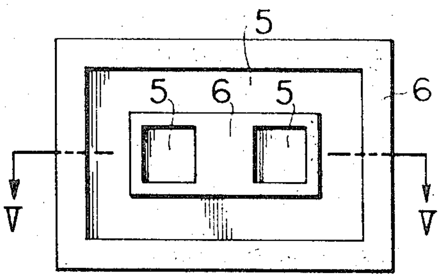
Figure 5:
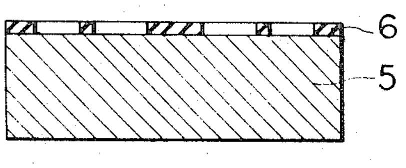

Within these drawings, FIGS. 4 and 5 show a production step of the bidirectional semiconductor element wherein an oxide layer 6 formed on the principal surface of an N-type semiconductor substrate 5, constituting the first region of the element, is partly removed employing a well known photoetching technique at positions corresponding to two mutually independent second regions and a third region encircling these second regions maintaining a part of the first region interposed therebetween.

Figure 6:
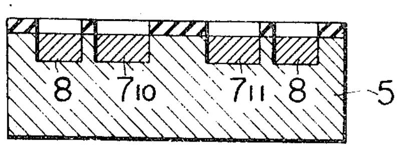
Figure 7:
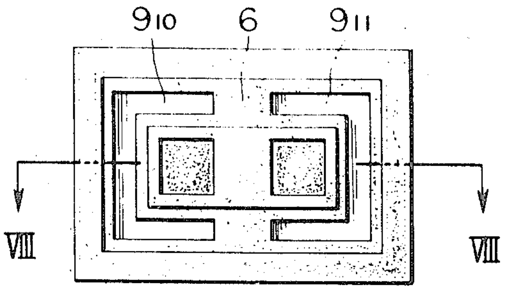
Figure 8:
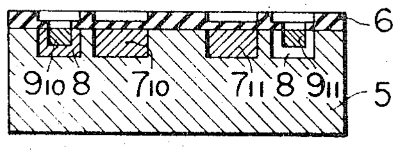

FIG. 6 shows a subsequent step of the production wherein a P-type impurity, for instance, boron is diffused into the areas wherefrom the oxide layer has been removed, so that the second regions $\mathbf{7}_{10}$ and $\mathbf{7}_{11}$ and the third region 8 are formed. The entire principal surface of the substrate 5 inclusive of the second regions and the third region is once more coated with an oxide layer and thereafter photoetched so that the oxide layer is removed at portions in the third region 8 corresponding to fourth regions $\mathbf{9}_{10}$ and $\mathbf{9}_{11}$ opposing each other. FIGS. 7 and 8 show still another step wherein the areas thus removed the oxide layer are now diffused with phosphor so that the fourth regions $\mathbf{9}_{10}$ and $\mathbf{9}_{11}$ of N-type conductivity are formed within the third region 8 independent from each other and opposing the second regions $\mathbf{7}_{10}$ and $\mathbf{7}_{11}$ respectively.

Thus, it is apparent that two of the four layer semiconductor switching elements having the first and the third regions commonly can be formed on the principal surface of a semiconductor substrate.

Figure 9:
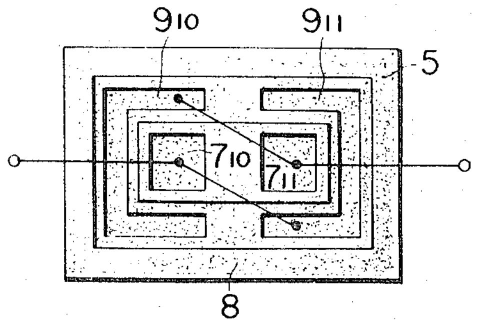

These two elements are then connected together in a reversely parallel manner as shown in FIG. 9. That is, the second region $\mathbf{7}_{10}$ and the fourth region $\mathbf{9}_{11}$, and the second region $\mathbf{7}_{11}$ and the other of the fourth region $\mathbf{9}_{10}$ are electrically connected together, for instance, by a well known method of vapor depositing aluminum layer, whereby a didirectional semiconductor switching element having an equivalent characteristic as the bidirectional semiconductor switching device as shown in FIG. 3 can be obtained.

By the above described procedure according to the present invention, a bidirectional element of a turn-on voltage as low as 5 V can be manufactured. Furthermore, since the bidirectional semiconductor switching element according to the present invention is produced on a principal surface of a semiconductor substrate as two of four layer semiconductor switching elements, the diffusion periods can be shortened to about one-fifteenth of the conventional method and various difficulties in the production can also be eliminated.

Although, in the above description of the invention, an N-type semiconductor substrate has been employed as the starting material for producing the bidirectional switching element, it will be apparent to those skilled in the art that a similar bidirectional switching element may also be produced by employing a P-type semiconductor substrate as its starting material.

We claim:

1. A bidirectional semiconductor switching element in composite form having two four layer semiconductor switching elements, connected together in a reverse parallel manner, each of the four layer semiconductor switching elements comprising a first region having one type of conductivity, a second region and a third region having another type of conductivity and separated by said first region, a fourth region provided continuously with said third region and having said one type of conductivity, the breakdown voltage of the PN junctions formed between said first, second and third regions being higher than that of another PN junction formed between said third and fourth regions respectively, and the first regions are shorted to each other and the third regions are shorted to each other.

2. A bidirectional semiconductor switching element comprising a first region having at least one principal surface formed of a semiconductive layer having one type of conductivity, two second regions having another type of conductivity independently diffused into one of the principal surfaces of said first region, a third region having another type of conductivity and diffused into the same principal surface of said first region so that said third region completely encircles said two second regions while maintaining a part of the first region interposed therebetween, and two fourth regions having said one type of conductivity and diffused into said third region so that the fourth regions respectively oppose said two second regions with respective pairs of said second and fourth regions being electrically connected together.

3. A bidirectional semiconductor switching device including a pair of multi-layer semiconductor switching elements electrically connected together in an inverse parallel relationship, each element comprising:

a first region having a first type of conductivity;

a second and a third region, each having a second type of conductivity and separated from each other by said first region to form with said first region respective first and second PN junctions having first and second breakdown voltages respectively; and a fourth region having said first type of conductivity separated from said first region by said third region and forming a third PN junction with said third region, the breakdown voltage of said third PN junction being different from one of the breakdown voltages of said first and second PN junction; first and third regions in each element of said pair being connected to the same regions of the other element of said pair, and wherein said breakdown voltage of said third PN junction is lower than said one breakdown voltage and wherein the third regions of each element are electrically connected together.

4. A bidirectional semiconductor switching device according to claim 3, wherein said first regions are formed of a semiconductor layer having a principal surface, into which each second region is independently diffused, each third region being diffused into the same principal surface of said first region so that said third regions are joined together and partially encircle each of said second regions while maintaining a part of said semiconductor layer interposed therebetween, and each fourth region of said pair of elements is diffused into said joined third regions, said fourth regions and said second regions which oppose each other being electrically connected together to form said inverse parallel relationship.

5. A bidirectional semiconductor switching element comprising a first region having at least one principal surface formed of a semiconductive layer having one type of conductivity, two second regions having another type of conductivity independently diffused into one of the principal surfaces of said first region, a third continuous region having another type of conductivity and diffused into the same principal surface of said first region so that said third region encircles said two second regions while maintaining a part of the first region interposed therebetween, and two fourth regions having said one type of conductivity and diffused into said third region so that the fourth regions respectively oppose said two second regions with respective pairs of said second and fourth regions being electrically connected together.

6. A bidirectional semiconductor switching device including a pair of multi-layer semiconductor switching elements electrically connected together in an inverse parallel relationship, each element comprising a first region having a first type of conductivity;

a second and a third region, each having a second type of conductivity and separated from each other by said first region, to form, with said first region, respective first and second P-N junctions having first and second breakdown voltages, respectively; and a fourth region, having said first type of conductivity, separated from said first region by said third region and forming a third P-N junction with said third region, the breakdown voltage of said third P-N junction being different from one of the breakdown voltages of said first and second P-N junction and wherein said first region and said third region in each element are electrically connected together.

7. A bidirectional semiconductor switching device according to claim 6, wherein said breakdown voltage of said third P-N junction is lower than said one breakdown voltage.

8. A bidirectional semiconductor switching element comprising a first region having at least one principal surface formed of a semiconductive layer having one type of conductivity, two second regions having another type of conductivity independently diffused into one of the principal surfaces of said first region, a third region having another type of conductivity and diffused into the same principal surface of said first region so that said third region partially encircles said two second regions while maintaining a part of the first region interposed therebetween, and two fourth regions having said one type of conductivity and diffused into said third region so that the fourth regions respectively oppose said two second regions with respective pairs of said second and fourth regions being electrically connected together, and a first part of said third region forming a P-N junction with one of said fourth regions, and a second part of said third region forming a P-N junction with the other of said fourth regions, and wherein said first and second parts of said third region are electrically directly connected together.

* * * * *